US010938385B2

(12) United States Patent
Huang et al.

(10) Patent No.: US 10,938,385 B2
(45) Date of Patent: Mar. 2, 2021

(54) LOSS OF SIGNAL DETECTION CIRCUIT

(71) Applicant: TEXAS INSTRUMENTS INCORPORATED, Dallas, TX (US)

(72) Inventors: Huanzhang Huang, Plano, TX (US); Amit Rane, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/936,462

(22) Filed: Jul. 23, 2020

(65) Prior Publication Data

US 2020/0350899 A1 Nov. 5, 2020

Related U.S. Application Data

(63) Continuation of application No. 16/535,557, filed on Aug. 8, 2019, now Pat. No. 10,763,841.

(60) Provisional application No. 62/716,415, filed on Aug. 9, 2018.

(51) Int. Cl.

| | |
|---|---|
| ***G06F 13/38*** | (2006.01) |
| ***H03K 17/00*** | (2006.01) |
| ***H03K 19/003*** | (2006.01) |
| ***H03K 17/56*** | (2006.01) |

(52) U.S. Cl.

CPC ......... *H03K 17/005* (2013.01); *G06F 13/382* (2013.01); *H03K 17/56* (2013.01); *H03K 19/003* (2013.01); *G06F 2213/0042* (2013.01)

(58) Field of Classification Search

CPC .... H03K 17/005; H03K 17/56; H03K 19/003; G06F 13/382; G06F 2213/0042

See application file for complete search history.

(56) References Cited

U.S. PATENT DOCUMENTS

| | | | | |
|---|---|---|---|---|
| 6,377,082 | B1 | 4/2002 | Loinaz et al. | |
| 7,996,749 | B2 * | 8/2011 | Ding | H04L 25/45 714/789 |
| 8,379,765 | B2 | 2/2013 | Farjad-Rad | |
| 9,197,237 | B2 * | 11/2015 | Ho | H03M 1/001 |

(Continued)

OTHER PUBLICATIONS

Compaq Computer Corporation et al., "Universal Serial Bus Specification," Revision 2.0, Apr. 27, 2000, 650 p. [Online: https://www.usb.org/document-library/usb-20-specification].

(Continued)

*Primary Examiner* — Dinh T Le

(74) *Attorney, Agent, or Firm* — John R. Pessetto; Charles A. Brill; Frank D. Cimino

(57) ABSTRACT

Aspects of the disclosure provide for a circuit. In some examples, the circuit includes a first inverter coupled between first and second nodes, a second inverter coupled between third and fourth nodes, and a first logic circuit having a first input coupled to the second node, a second input coupled to the fourth node, and an output, a first positive feedback circuit coupled between the first and third nodes and having a control input. The first positive feedback circuit comprises a first switch coupled between the first and fifth nodes and having a control input, a second switch coupled between the third and sixth nodes and having a control input, a third inverter having an input coupled to the sixth node and an output coupled to the fifth node, and a fourth inverter having an input coupled to the fifth node and an output coupled to the sixth node.

8 Claims, 3 Drawing Sheets

(56) References Cited

U.S. PATENT DOCUMENTS

| | | | |
|---|---|---|---|
| 9,946,322 | B2 | 4/2018 | Yehezkely et al. |
| 2014/0006652 | A1 | 1/2014 | Chen et al. |
| 2014/0346890 | A1 | 11/2014 | Haseno et al. |
| 2016/0162427 | A1 | 6/2016 | Kang et al. |
| 2017/0052578 | A1 | 2/2017 | Agarwal |

OTHER PUBLICATIONS

Compaq Computer Corporation, "USB 2.0 Adopters Agreement," Apr. 14, 2011, 6 p. [Online: https://www.usb.org/document-library/usb-20-specification].
Compaq Comupter Corporation et al., "Errata for 'USB Revision 2.0 Apr. 27, 2000' as of Dec. 7, 2000," 31 p. [Online: https://www.usb.org/document-library/usb-20-specification].
Compaq Comuter Corporation et al., "USB 2.0 Specification Engineering Change Notice (ECN) #1: Mini-B Connector," Oct. 20, 2000, 45 p. [Online: https://www.usb.org/document-library/usb-20-specification].
Compaq Computer Corporation et al., "Pull-Up/Pull-Down Resistors," USB Engineering Change Notice, 5 p. [Online: https://www.usb.org/document-library/usb-20-specification].
Compaq Computer Corporation et al., "Errata for 'USB Revision 2.0 Apr. 27, 2000' as of May 28, 2002," 7 p. [Online: https://www.usb.org/document-library/usb-20-specification].
Compaq Computer Corporation et al., "Interface Association Descriptors," USB Engineering Change Notice, 5 p. [Online: https://www.usb.org/document-library/usb-20-specification].
Compaq Computer Corporation et al., "Rounded Chamfer," Engineering Change Notice, Oct. 8, 2003, 3 p. [Online: https://www.usb.org/document-library/usb-20-specification].
Compaq Computer Corporation et al., "Unicode UTF-16LE for String Descriptors," USB Engineering Change Notice, Feb. 21, 2005, 2 p. [Online: https://www.usb.org/document-library/usb-20-specification].
Compaq Computer Corporation et al., "Inter-Chip USB Supplement to the USB 2.0 Specification," Revision 1.0, Mar. 13, 2006, 48 p. [Online: https://www.usb.org/document-library/usb-20-specification].
Compaq Computer Corporation et al., "Device Class Specification Adopters Agreement," Apr. 4, 2007, 5 p. [Online: https://www.usb.org/document-library/usb-20-specification].
Compaq Computer Corportion et al, "USB 2.0 Link Power Management Addendum," Engineering Change Notice, Jul. 16, 2007, 29 p. [Online: https://www.usb.org/document-library/usb-20-specification].
Compaq Computer Corporation et al., "High-Speed Inter-Chip USB Electrical Specification," Version 1.0, Sep. 23, 2007, 16 p. [Online: https://www.usb.org/document-library/usb-20-specification].
Compaq Computer Corporation et al., "Suspend Current Limit Changes," USB Engineering Change Notice, Apr. 9, 2008, 2 p. [Online: https://www.usb.org/document-library/usb-20-specification].
Compaq Computer Corporation et al., "5V Short Circuit Withstand Requirement Change," USB Engineering Change Notice, Dec. 22, 2008, 2 p. [Online: https://www.usb.org/document-library/usb-20-specification].
Compaq Computer Corporation et al., "Device Capacitance," USB Engineering Change Notice, Dec. 22, 2008, 2 p. [Online: https://www.usb.org/document-library/usb-20-specification].
Compaq Computer Corporation et al., "Material Change," USB Engineering Change Notice, Dec. 22, 2008, 3 p. [Online: https://www.usb.org/document-library/usb-20-specification].
Compaq Computer Corporation et al., "USB 2.0 Phase-Locked SOFs," USB Engineering Change Notice, Dec. 22, 2008, 2 p. [Online: https://www.usb.org/document-library/usb-20-specification].
Compaq Computer Corporation et al., "USB 2.0 DC Resistance," USB Engineering Change Notice, Dec. 22, 2008, 8 p. [Online: https://www.usb.org/document-library/usb-20-specification].
Compaq Computer Corporation et al., An Examination of the Effect of Power to Signal & of Signal to Power (Supplement for XV-4687C), Dec. 2, 2009, 15 p. [Online: https://www.usb.org/document-library/usb-20-specification].
Compaq Computer Corporation et al., "Clarification on the Chamfer on USB 2.0 Micro Connectors," USB Engineering Change Notice, Mar. 23, 2010, 4 p. [Online: https://www.usb.org/document-library/usb-20-specification].
Compaq Computer Corporation et al., "Maximum Un-Mating Force Value Definition to Micro Connector USB 2.0," Mar. 23, 2010, 3 p. [Online: https://www.usb.org/document-library/usb-20-specification].
Compaq Computer Corporation et al., "'On-The-Go Supplement to the USB 2.0 Specification' Adopters Agreement," May 26, 2009, 1 p. [Online: https://www.usb.org/document-library/usb-20-specification].
Compaq Computer Corporation et al., "USB Test_Mode Selector Values," USB Engineering Change Votice, Jul. 26, 2010, 3 p. [Online: https://www.usb.org/document-library/usb-20-specification].
Compaq Computer Corporation et al., "Errata for USB 2.0 ECN: Link Power Management (LPM)—Jul. 2007," Sep. 28, 2011, 8 p. [Online: https://www.usb.org/document-library/usb-20-specification].
Compaq Computer Corporation et al., "On-The-Go and Embedded Host Supplement to the USB Revision 2.0 Specification," Revision 2.0 version 1.1a, Jul. 27, 2012, 96 p. [Online: https://www.usb.org/document-library/usb-20-specification].
Compaq Computer Corporation et al., "HSIC ECN," USB Engineering Change Notice, May 21, 2012, 6 p. [Online: https://www.usb.org/document-library/usb-20-specification].
Compaq Computer Corporation et al., USB 2.0 Connect Timing Update, USB Engineering Change Notice, Apr. 4, 2013, 6 p. [Online: https://www.usb.org/document-library/usb-20-specification].
Compaq Computer Corporation et al., "Disconnect Supplement to High Speed Inter Chip Specification," Revision 1.0, Sep. 18, 2013, 8 p. [Online: https://www.usb.org/document-library/usb-20-specification].
Compaq Computer Corporation et al., "USB 2.0 VBUS Max Limit," Aug. 11, 2014, 5 p. [Online: https://www.usb.org/document-library/usb-20-specification].
Compaq Computer Corporation et al., "Maximum Vbus Voltage," Nov. 26, 2014, 4 p. [Online: https://www.usb.org/document-library/usb-20-specification].
"Quad Type Cable Additional for Micro USB," 3 p.
"MicroUSB Micro-B ID Pin Resistance and Tolerance Stack-Up between D+ and D−," USB Engineering Change Notice, 2 p.
Compaq Computer Corporation et al., Universal Serial Bus Micro-USB Cables and Connectors Specification, Revision 1.01, Apr. 4, 2007, 36 p.
Fujikura Ltd., "ECN Proposal for Micro-USB Cables," Aug. 15, 2008, 23 p.
Compaq Computer Corporation et al., "On-The-Go and Embedded Host Supplement to the USB Revision 2.0 Specification," Revision 2.0, version 1.1a, Jul. 27, 2012, 96 p.
Apple Inc. et al., Embedded USB2 (eUSB2) Physical Layer Supplement to the USB Revision 2.0 Specification, Revision 1.1, Copyright 2018 Apple Inc. et al., 164 p.
International Search Report in corresponding PCT Application No. PCT/US2019/04586, dated Nov. 14, 2019 (2 pages).

* cited by examiner

LOSS OF SIGNAL DETECTION CIRCUIT

CROSS-REFERENCE TO RELATED APPLICATIONS

This continuation application claims priority to U.S. patent application Ser. No. 16/535,557, filed Aug. 8, 2019, which application claims the benefit of and priority to U.S. Provisional Application No. 62/716,415, filed Aug. 9, 2018, both of which are incorporated herein by reference in their entirety.

SUMMARY

Aspects of the present disclosure provide for a system. In at least some examples, the system includes an embedded Universal Serial Bus 2 (eUSB2) device having a loss of signal detector. The loss of signal detector includes a first differential comparator having a first input coupled to a first node, a second input coupled to a second node, and an output coupled to a third node, a second differential comparator having a first input coupled to the second node, a second input coupled to the first node, and an output coupled to a fourth node. The loss of signal detector further includes a first positive feedback circuit coupled between the third node and the fourth node, a first inverter coupled between the third node and a fifth node, a second inverter coupled between the fourth node and a sixth node, and a first logic circuit having a first input coupled to the fifth node, a second input coupled to the sixth node, and an output.

Other aspects of the present disclosure provide for a circuit. In at least one example, the circuit includes a first differential comparator having a first input coupled to a first node, a second input coupled to a second node, and an output coupled to a third node. The circuit further includes a second differential comparator having a first input coupled to the second node, a second input coupled to the first node, and an output coupled to a fourth node. The circuit further includes a first inverter coupled between the third node and a fifth node, a second inverter coupled between the fourth node and a sixth node, and a first logic circuit having a first input coupled to the fifth node, a second input coupled to the sixth node, and an output. The circuit further includes a second logic circuit having a first input coupled to the third node, a second input coupled to the fourth node, and an output, a resistor coupled between the output of the second logic circuit and a seventh node, and a capacitor coupled between the seventh node and a ground node. The circuit further includes a first positive feedback circuit coupled between the third node and the fourth node and having a control input coupled to the seventh node.

Other aspects of the present disclosure provide for a circuit. In at least some examples, the circuit includes a first inverter coupled between a first node and a second node, a second inverter coupled between a third node and a fourth node, and a first logic circuit having a first input coupled to the second node, a second input coupled to the fourth node, and an output. The circuit further includes a first positive feedback circuit coupled between the first node and the third node and having a control input. The first positive feedback circuit includes a first switch coupled between the first node and a fifth node, the first switch having a control input, a second switch coupled between the third node and a sixth node, the second switch having a control input, a third inverter having an input coupled to the sixth node and an output coupled to the fifth node, and a fourth inverter having an input coupled to the fifth node and an output coupled to the sixth node.

BRIEF DESCRIPTION OF THE DRAWINGS

For a detailed description of various examples, reference will now be made to the accompanying drawings in which.

DETAILED DESCRIPTION

Figure 1:
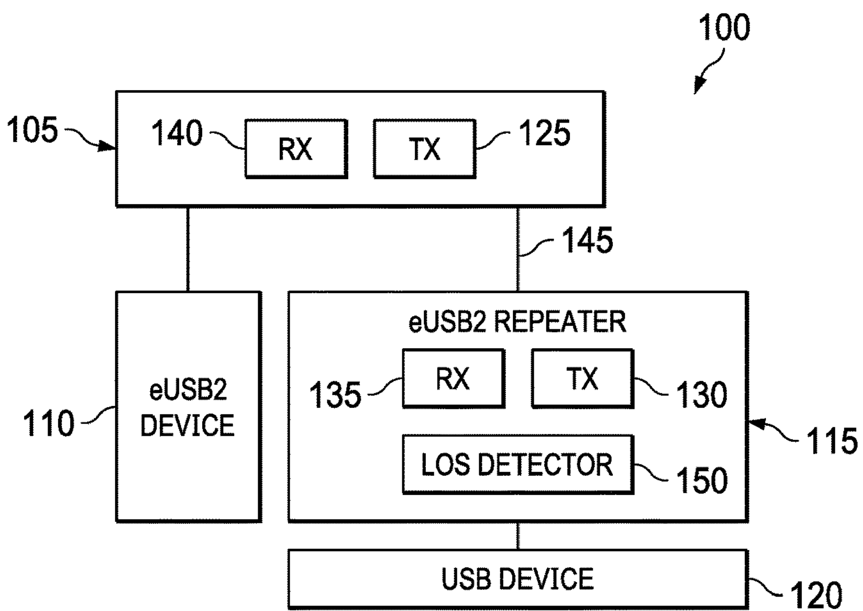
FIG. 1 shows a block diagram of an illustrative system in accordance with various examples.

Universal Serial Bus (USB) is a standard establishing specifications for interconnect cabling, connectors, and communication protocols. As referred to herein, USB refers to any version of the USB specification, including any amendments or supplements, certified by the USB Implementers Forum (USB IF) or any suitable body who replaces and/or aids the USB IF in its role overseeing the USB specification, whether now existing or later developed. In at least one example, USB, as referred to herein, encompasses any one or more of the USB 1.0 specification, USB 2.0 specification, USB 3.0 specification, USB 4.0 specification, or any derivatives thereof, such as amended or ".x" variations of the above specifications. Also, as referred to herein, legacy USB refers to USB 2.x and/or USB 1.x. Embedded USB (eUSB), in at least some examples, refers to eUSB2.

At its inception, USB was primarily intended for implementation in specifying standards for connection and communication between personal computers and peripheral devices. However, as adoption of the USB standard has expanded and implementation in computing devices of support for the USB standard has gained in popularity, efforts have been made to extend and expand the applicability of USB. For example, while initially establishing specifications for communications between personal computers and peripheral devices, USB has expanded to communication between peripheral devices, between personal computers, and other use cases. As a result of such widespread implementation and use of USB, efforts are being further made to utilize USB as a communication protocol among individual subsystems or circuits (e.g., such as a system-on-a-chip (SoC)). Such implementations are sometimes referred to as eUSB2. New challenges arise in implementing eUSB2. For example, at a circuit level, computing devices often operate at voltage levels that vary from those of conventional USB, creating an impediment between direct communication between eUSB2 and legacy USB systems. To mitigate this impediment, an eUSB2 repeater operates as a bridge or non-linear re-driver between eUSB2 and legacy USB systems, or vice versa, to translate between legacy USB signaling voltage levels that are customarily about 3.3 volts (V) and eUSB2 signaling voltage levels that are circuit-level (e.g., silicon appropriate voltages) such as about 1.0 V, 1.2 V, 1.4 V, or any other suitable value less than 3.3 V.

Signaling lines in USB and/or eUSB2 systems are, in at least some examples, differential and bidirectional communication lines. For this reason, in at least some implementations it becomes beneficial to know when the signaling lines are available for transmission. For example, when a first device transmits to a second device over the signaling lines, in some examples it is advantageous for the second device to be able to determine that the first device is no longer transmitting and the second device is now free to transmit to the first device over the signaling lines. Data packets in communication between USB and eUSB2 systems end with an end of packet (EOP) indicator. However, the EOP indicator does not necessarily indicate an end to transmission by a device, merely the end of a particular data packet. Therefore, to determine whether a device has ceased transmitting over the signaling lines, a differential voltage of the signaling lines is determined.

For example, after a final bit of the EOP indicator of communication in a USB or eUSB2 system is transmitted via differential signal lines, in at least some examples the eUSB2 specification requires a transmitter (or a circuit coupled to an output of the transmitter) to drive the differential signal lines low (e.g., couple each of the differential input signals to a ground potential through an about 40 ohm, or other comparatively small value, resistor) for a maximum of 4 unit intervals (UIs), where a unit interval is the period of time for transmitting 1 bit of data. In at least some examples, driving the differential signals low is synonymous with driving the differential signal lines with a logic '0' through a low resistance path. Driving each of the differential signal lines low, in at least some examples, is intended to clear each of the signal lines of any data or voltage remaining on either of the differential signal lines. After the differential signal lines are driven low, a weak pull-down is activated to place the differential signal lines in a high-impedance (e.g., high-z) state, enabling, in some examples, single-ended communication via either of the differential signal lines or a receiving device to then begin transmitting over the differential signal lines. The high-impedance state is defined as, in some examples, coupling each of the differential signal lines to the ground potential (e.g., driving the differential signal lines with a logic '0') through an about 7 kiloohm, or other comparatively large value, resistor or resistance path. When the differential signal lines are driven low, in at least some examples, a receiving device is enabled to determine that a loss of signal (LOS) has occurred on the differential signal lines. This informs the receiving device that the transmitter has completed transmission and the differential signal lines are available for the receiving device to begin transmitting over the differential signal lines. This LOS is, in some examples, determined by a LOS detector.

However, at least some LOS detectors are designed to have a comparatively slow response time (e.g., up to about 3 UI or longer) due to signal filtering to prevent false or incorrect LOS detection triggering during normal bit transitions of data on the differential signal lines. In at least some implementations, such approaches are incompatible with requirements for fast response LOS detection with a minimum propagation delay. However, to remove the signal filtering creates a possibility for false or incorrect LOS detection triggering during normal signal transitions, causing jitter on the differential signal lines when LOS detection is used to control enablement of an output driver, or causing other incorrect system functions. Furthermore, a filter for performing the signal filtering to prevent the false or incorrect LOS detection triggering during normal operation, in at least some examples, includes a resistor-capacitor (RC) filter or an inductor-capacitor (LC) filter, each of which is comparatively large in size as opposed to semiconductor devices (e.g., such as digital logic circuits). Accordingly, a LOS detector for performing fast LOS detection (e.g., such as in 2 UI or less) while also mitigating opportunity for false LOS detection triggers is desirable for some circuit implementations.

At least some aspects of the present disclosure provide for a circuit. The circuit, in at least some examples, is suitable for implementation as an LOS detector. While for the sake of simplicity the circuit disclosed herein is described generally with respect to USB and/or eUSB2, the circuit has more broad applicability. For examples, in at least some examples the circuit is suitable for any implementation of LOS detection in which LOS on differential signal lines is indicated by the differential signal lines being driven low. In some examples, the circuit is an eUSB2 repeater suitable for use in interfacing between eUSB2 and USB interfaces. In other examples, the circuit is a USB device, and in yet other examples the circuit is an eUSB2 device.

The circuit, in at least some examples, provides for detection of LOS on differential signal lines within about 2 UI. At least some implementations of the circuit explicitly do not include a filter in the output signal path of the LOS detection circuit for filtering an output of the LOS detection circuit to prevent false LOS detection triggers (e.g., by filtering an output of the LOS detection circuit to delay output of the output of the LOS detection circuit for a predefined amount of time to mitigate against false LOS detection triggers). Further, in at least some examples, implementation of the circuit explicitly does not include a phase-locked loop or other clock for signal timing, or retiming at the chip level. To implement the LOS detection without filtering in an output signal path to mitigate false LOS detection triggers, in at least some examples, the circuit includes one or more comparators for determining a magnitude of signals present on the differential signal lines and one or more switchable positive feedback circuits and/or components. Implementation of the positive feedback circuits, in some examples, reduces a non-overlapping region of output for outputs of the one or more comparators, thereby mitigating a possibility of the non-overlapping region of operation causing a false LOS detection, thereby achieving a comparatively fast (e.g., about 2 UI or less) squelch detection time (e.g., determination that both lines of the differential signal lines have been driven low).

Turning now to FIG. 1, a block diagram of an illustrative system 100 is shown. In at least some examples, the system 100 is illustrative of a computing device, or elements of a computing device. For example, the system 100 includes a processor 105, an eUSB2 device 110, an eUSB2 repeater 115, and a USB device 120. In at least some examples, the processor 105 includes, or is coupled to, a transmitter (TX) 125 and a receiver (RX) 140, and the eUSB2 repeater 115 includes a TX 130, a RX 135, and a LOS detector 150. The USB device 120 is a legacy USB device, as described elsewhere herein. In some examples, one or both of the eUSB2 device 110 or the USB device 120 is implemented external to the system 100 and configured to couple to the system 100 through an appropriate interface (e.g., such as a port and receptacle suitable for performing communication according to eUSB2 or USB protocol, respectively. The processor 105 is, in some examples, a SoC. The eUSB2 device 110 is any device operating in both ingress and egress communication directions according to signal voltage level specifications for eUSB2. The USB device 120 is any device operating in both ingress and egress communication directions according to signal voltage level specifications for legacy USB. For example, in at least some implementations the USB device 120 is a peripheral such as a user input device, (e.g., a sensor, a scanner, an imaging device, a microphone, etc.), an output device (e.g., a printer, speakers, etc.), a storage device, or any other peripheral, component, or device suitable for communicating with the processor 105.

The eUSB2 repeater 115 communicatively couples the processor 105 to the USB device 120 and vice versa, converting signals appropriate for the processor 105 to signals appropriate for the USB device 120 and vice versa. For example, in some implementations signaling in the processor 105 is performed in a range of about 0.8 V to about 1.4 V. Similarly, in some implementations signaling in the USB device 120 is performed at about 3.3 V or about 5 V. In at least some examples, the eUSB2 repeater 115 operates as a bit-level repeater, receiving signals from one of the processor 105 or USB device 120 and converting the signals for use by the other of the processor 105 or USB device 120 (e.g., by shifting a voltage level of the signals upward or downward based on a direction of the communications). For example, in at least some implementations the TX 130 transmits data to the RX 140 according to eUSB2 protocols. In some examples, differential data communicated in the system 100 begins with a start of packet (SOP) indicator and ends with an EOP indicator.

In at least some examples, the TX 125 transmits data according to eUSB2 protocols or standards via differential signal lines 145 that is received by the RX 135 and the TX 130 transmits data according to eUSB2 protocols or standards via the differential signal lines 145 that is received by the RX 140. For example, when the LOS detector 150 determines that the TX 125 has stopped transmitting to the RX 135 via the differential signal lines 145, in at least some examples, the TX 130 transmits data via the differential signal lines 145 to the RX 140. In some examples, the LOS detector 150 determines that the TX 125 has stopped transmitting to the RX 135 via the differential signal lines 145 when both polarities of the differential signal lines 145 are driven low (e.g., such that values present on both polarities of the differential signal lines 145 are less than a predefined threshold for indicating that the differential signal lines 145 are idle). The LOS detector 150 determines that the differential signal lines 145 have been driven low, in some examples, by determining a magnitude of both positive and negative polarities of the differential signal lines 145. The determination is made, in some examples, by one or more comparators (not shown). When both positive and negative polarities of the differential signal lines 145 are driven low, the LOS detector 150 determines that the TX 125 has stopped transmitting and the differential signal lines 145 are available for the TX 130 to begin transmitting (e.g., such as according to eUSB2 protocols). In some examples, a limited edge rate (e.g., limited rise time and/or fall time) in a signal path of signals on the differential signal lines 145 causes a non-overlapping region in outputs of the comparators of the LOS detector 150. The non-overlapping region is, in some examples, a period of time between a point at which a signal present on the positive polarity of the differential signal lines 145 falls below a threshold and a later point at which a signal present on the negative polarity of the differential signal lines 145 rising above the threshold, or vice versa. To prevent false LOS triggers by the LOS detector 150 when determining the magnitude of both positive and negative polarities of the differential signal lines 145, in at least some examples the LOS detector 150 implements one or more positive feedback circuits (not shown). The positive feedback circuits, in at least some examples, provide positive feedback to outputs of the comparators of the LOS detector 150 to mitigate, reduce, eliminate, and/or compensate for the non-overlapping region in the outputs of the comparators of the LOS detector 150. The outputs of the comparators, with the added positive feedback, are processed by one or more logic circuits (not shown) to generate a final LOS output signal of the LOS detector 150. In some examples, the one or more logic circuits include an AND logic circuit, an inverting AND (NAND logic circuit), a buffer (e.g., an inverter logic circuit), or any other circuit suitable of implementing a logical function. In at least some examples, the positive feedback of the positive feedback circuits mitigates false LOS triggering by the LOS detector 150 and eliminates a need to include a filter in an output signal path of the LOS detector 150 for preventing a non-overlapping region in an output of comparators of the LOS detector 150 causing a false LOS detection trigger. In at least some examples, one or more filters are implemented in the LOS detector 150 other than in the output signal path of the LOS detector 150.

Figure 2:
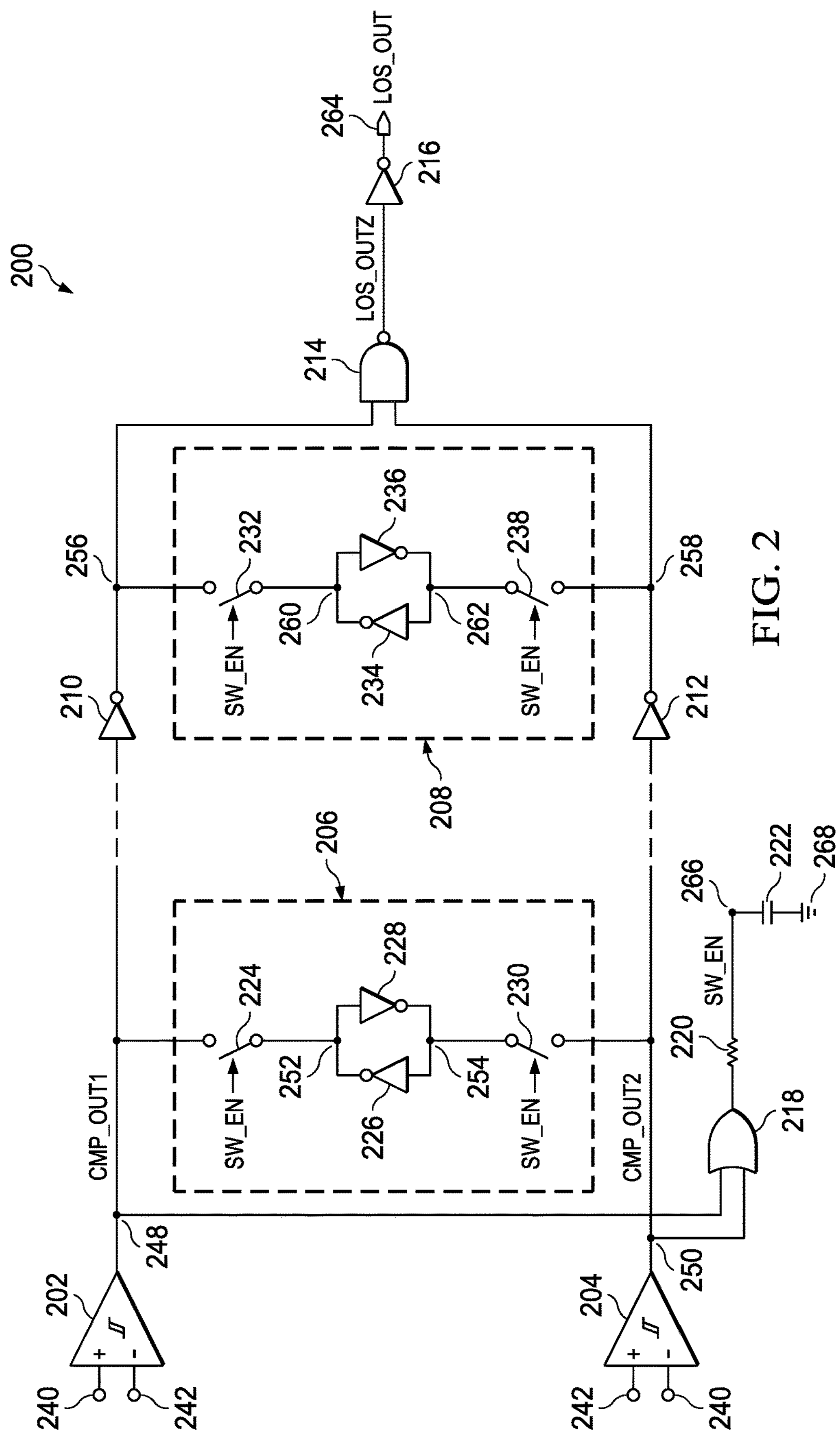
FIG. 2 shows a schematic diagram of an illustrative circuit in accordance with various examples.

Turning now to FIG. 2, a schematic diagram of an illustrative circuit 200 is shown. In at least some examples, the circuit 200 is suitable for implementation as a LOS detector. For example, at least some implementations of the circuit 200 are suitable for implementation as the LOS detector 150 of the system 100 of FIG. 1. The circuit 200 includes, in some examples, a comparator 202, a comparator 204, a feedback circuit 206, a feedback circuit 208, an inverter 210, an inverter 212, a logic circuit 214, an inverter 216, a logic circuit 218, a resistor 220, and a capacitor 222. The feedback circuit 206 is, in some examples, a positive feedback circuit that includes a switch 224, an inverter 226, an inverter 228, and a switch 230. The feedback circuit 208 is, in some examples, a positive feedback circuit that includes a switch 232, an inverter 234, an inverter 236, and a switch 238.

While only the feedback circuit 206 is shown as being coupled between a node 248 and a node 250 in the circuit 200, in various examples any number of feedback circuits substantially similar in architecture and operation to the feedback circuit 206 are coupled between the node 248 and the node 250. Adding additional feedback stages between the node 248 and the node 250, in at least some examples, provides programmability to adapt to variations in differential input signal edge rate and channel loss profiles. In at least some examples, each feedback circuit included in the circuit 200 is isolated from other feedback circuits by inverters, such as illustrated by the inverter 210 and the inverter 212 isolating the feedback circuit 206 from the feedback circuit 208. In yet other examples, each programmable stage of the circuit 200 (where a programmable stage includes one or more feedback circuits that are programmable to provide positive feedback according to a control signal (SW_EN) while another programmable stage does not provide positive feedback for the same value of SW_EN) is isolated from other feedback circuits by inverters, such as illustrated by the inverter 210 and the inverter 212 isolating the feedback circuit 206 from the feedback circuit 208.

In at least some examples, when an even number of inverters are in series between the node 248 and the first input terminal of the logic circuit 214 (and similarly between the node 250 and the second input terminal of the logic circuit 214, the logic circuit 214 is implemented to perform a logical OR operation (e.g., OR when the inverter 216 is included in the circuit 200 or NOR when the inverter 216 is not included in the circuit 200). In at least some examples, when an odd number of inverters are in series between the node 248 and the first input terminal of the logic circuit 214 (and similarly between the node 250 and the second input terminal of the logic circuit 214, the logic circuit 214 is implemented to perform a logical AND operation (e.g., AND when the inverter 216 is not included in the circuit 200 or NAND when the inverter 216 is included in the circuit 200). Further, in at least some examples, the feedback circuit 208, inverter 210, and inverter 212 are omitted from the circuit 200 such that substantially all positive feedback provided in the circuit 200 is provided by the feedback circuit 206 and the logic circuit 214 is implemented to perform a logical OR operation (e.g., OR when the inverter 216 is included in the circuit 200 or NOR when the inverter 216 is not included in the circuit 200). In yet other examples, the feedback circuit 208 is omitted from the circuit 200 such that substantially all positive feedback provided in the circuit 200 is provided by the feedback circuit 206 and the logic circuit 214 is implemented to perform a logical AND operation (e.g., AND when the inverter 216 is not included in the circuit 200 or NAND when the inverter 216 is included in the circuit 200). In at least some examples, in which further or additional feedback circuits are included in the circuit 200, one or more additional logic circuits (not shown) are included in the circuit 200 to control which of the feedback circuits are active at a given time, providing programmability to a multi-stage positive feedback system. As one example, the additional logic circuits perform an AND logic operation between a signal present at a node 266, as is discussed in greater detail below, and an enabling signal for a respective feedback circuit to enable or disable that respective feedback circuit.

In at least some implementations of the circuit 200, the comparator 202 has a first input coupled to a node 240, a second input coupled to a node 242, and an output coupled to the node 248. The comparator 204 has a first input coupled to the node 242, a second input coupled to the node 240, and an output coupled to the node 250. In at least some examples, the node 240 is configured to receive a positive polarity of a differential input signal and the node 242 is configured to receive a negative polarity of the differential input signal. The feedback circuit 206 is coupled between the node 248 and the node 250. The inverter 210 is coupled between the node 248 and the node 256. The inverter 212 is coupled between the node 250 and the node 258. The feedback circuit 208 is coupled between the node 256 and the node 258. The logic circuit 214 has a first input coupled to the node 256, a second input coupled to the node 258, and an output. The inverter 216 is coupled between the output of the logic circuit 214 and a node 264. The logic circuit 218 has a first input coupled to the node 248, a second input coupled to the node 250, and an output coupled through the resistor 220 to the node 266. The capacitor 222 is coupled between the node 266 and a ground node 268. In at least some examples of the feedback circuit 206, the switch 224 is coupled between the node 248 and a node 252, the switch 230 is coupled between the node 250 and the node 254, the inverter 226 has an input coupled to the node 254 and an output coupled to the node 252, and the inverter 228 has an input coupled to the node 252 and an output coupled to the node 254. In at least some examples of the feedback circuit 208, the switch 232 is coupled between the node 256 and a node 260, the switch 238 is coupled between the node 258 and the node 262, the inverter 234 has an input coupled to the node 262 and an output coupled to the node 260, and the inverter 236 has an input coupled to the node 260 and an output coupled to the node 262. Each of the switch 224, the switch 230, the switch 232, and the switch 238 have a control terminal coupled to (or are otherwise configured to be controlled by) the node 266. For example, in at least some implementations the switch 224, the switch 230, the switch 232, and the switch 238 are transistor devices each having a gate terminal coupled to the node 266 or each controlled at least partially according to the signal present at the node 266 (e.g., such as directly controlled by one or more logic circuits (not shown) that perform one or more operations utilizing the signal present at the node 266 as an input.

In an example of operation of the circuit 200, the comparator 202 and comparator 204 are each coupled to differential signal lines to determine a magnitude of a signal present on the differential signal lines. For example, the comparator 202 is configured to receive a signal (LOS_INP) from a positive polarity of a differential input signal at a positive input terminal of the comparator and a signal (LOS_INM) from a negative polarity of the differential input signal at a negative input terminal of the comparator 202. Similarly, the comparator 204 is configured to receive LOS_INM at a positive input terminal of the comparator 204 and receive LOS_INP at a negative input terminal of the comparator 204. Based on the determined magnitude, the comparator 202 generates an output CMP_OUT1 and the comparator 204 generates an output CMP_OUT2. For example, when the comparator 202 determines that a value of LOS_INP-LOS_INM has fallen below a value of a reference threshold (e.g., an internal reference threshold of the comparator 202) , the comparator 202 outputs CMP_OUT1 having a de-asserted, or logical low, value. Conversely, when the comparator 202 determines that a value of LOS_INP-LOS_INM is equal to or greater than the value of the reference threshold of the comparator 202, the comparator 202 outputs CMP_OUT1 having an asserted, or logical high, value. Similarly, when the comparator 204 determines that a value of LOS_INM-LOS_INP has fallen below a value of a reference threshold (e.g., an internal reference threshold of the comparator 204), the comparator 204 outputs CMP_OUT2 having a de-asserted, or logical low, value. Conversely, when the comparator 204 determines that a value of LOS_INP-LOS_INM is equal to or greater than the value of the reference threshold of the comparator 204, the comparator 204 outputs CMP_OUT2 having an asserted, or logical high, value.

In at least some examples, both CMP_OUT1 and CMP_OUT2 are de-asserted when an LOS event has occurred. However, in at least some examples, during a normal data bit transition of a differential signal transmitted via the differential signal lines to which the comparator 202 and the comparator 204 are coupled, CMP_OUT1 and CMP OUT2 are both de-asserted when an LOS event has not occurred. This creates a non-overlapping region in CMP_OUT1 and CMP_OUT2. This non-overlapping region, in some examples, causes a false trigger in a LOS detection output signal (LOS_OUT), leading to the inclusion of a glitch, or erroneous output, in LOS_OUT corresponding in duration to the non-overlapping region of CMP_OUT1 and CMP_OUT2. To mitigate this glitch, as discussed above, some LOS detector implementations include a filter that filters LOS_OUT, creating a delay in output (such as, often, about 2 UI) of LOS_OUT such that a filtering approach is sometimes incompatible with a fast detection circuit specification or requirement. Therefore, the circuit 200 does not include a filter in an output signal path of the circuit 200 to mitigate inclusion of a glitch in LOS_OUT resulting from the non-overlapping region of CMP_OUT1 and CMP_OUT2, but instead implements the feedback circuit 206 and the feedback circuit 208 to mitigate the existence of the non-overlapping region of CMP_OUT1 and CMP_OUT2 such that the non-overlapping region of CMP_OUT1 and CMP_OUT2 does not exist to cause a glitch in LOS_OUT.

The logic circuit 218 is, in some examples, a circuit capable of and/or suitable for performing a logical OR operation. When either CMP_OUT1 or CMP_OUT2, or both CMP_OUT1 and CMP_OUT2, are asserted, the logic circuit 218 outputs a signal that also is asserted. The resistor 220 and the capacitor 222 form a resistor-capacitor (RC) filter such that a value of SW_EN present at the node 266 increases with time according to an RC constant of the resistor 220 and the capacitor 222. In at least some examples, the circuit 200 further includes supplementary circuitry (not shown) that charges the capacitor 222 at startup of the circuit 200 to initialize the capacitor 222 and prepare it for operation in generating SW_EN as described herein. SW_EN controls activation and deactivation of the feedback circuit 206 and the feedback circuit 208. For example, when a value of SW_EN rises above a switching threshold (e.g., is sufficient to cause the switch 224, the switch 230, the switch 232, and/or the switch 238 to begin conducting), the feedback circuit 206 and the feedback circuit 208 are enabled and provide feedback. When the value of SW_EN is less than the switching threshold, the feedback circuit 206 and the feedback circuit 208 are disabled and do not provide feedback. In this way, when both CMP_OUT1 and CMP_OUT2 are de-asserted, node 266 rapidly discharges to turn off the feedback circuit 206 and the feedback circuit 208 and enable accurate LOS detection by the circuit 200. However, by implementing the feedback of the feedback circuit 206 and the feedback circuit 208, based on control exerted by SW_EN, the non-overlapping region is mitigated such that CMP_OUT1 and CMP_OUT2 have a non-zero value overlap until LOS occurs. For example, a positive feedback circuit such as the feedback circuit 206 and/or the feedback circuit 208 has a high regenerative gain, thereby causing the feedback circuit to amplify small differences between signal paths. In the circuit 200, during normal signal transitions of the differential input signal, when the comparator 202 output rapidly drops and the comparator 204 output stays at a ground level, the positive feedback begins and slows a falling edge rate of the signal present at the node 248 decreases in value while gradually increasing in value the signal present at the node 250. This maintains the signal present at the node 248 as an analog inversion of the signal present at the node 250, mitigating, reducing, and/or eliminating a non-over-lapping region in the signal present at the node 248 and the signal present at the node 250.

For example, when SW_EN causes the switch 224 and the switch 230 to enter conductive states, coupling the node 248 to the node 252 and the node 250 to the node 254, respectively, the feedback of the feedback circuit 206 is enabled. When the feedback of the feedback circuit 206 is enabled, the inverter 226 inverts a signal present at the node 254 to provide positive feedback at the node 252 and the inverter 228 inverts a signal present at the node 252 to provide positive feedback at the node 254. The feedback is referred to as positive feedback because it reinforces a value of a signal already present at the node receiving the positive feedback.

The signals present at the node 248 and the node 250 are inverted in value by the inverter 210 and the inverter 212, respectively, to provide signals at the node 256 and the node 258. The feedback circuit 208 provides further positive feedback at the node 256 and the node 258 in substantially the same manner as the feedback circuit 206 at the node 248 and the node 250, and detailed description of operation is not repeated herein for the feedback circuit 208, but instead reference is made to the description of like components of the feedback circuit 206. The logic circuit 214, in some examples, performs an inverting AND operation on signals present at the node 256 and the node 258 to generate an inverted version of LOS_OUT (LOS_OUTZ) which is subsequently inverted by the inverter 216 to form LOS_OUT that is provided at the node 264. In at least some examples, such as when the circuit 200 is configured to couple at the node 264 to a device or component having a small capacitive load, the logic circuit 214 performs an AND operation on signals present at the node 256 and the node 258 and the inverter 216 is omitted such that an output of the logic circuit 214 is provided at the node 264.

In at least some examples, the above feedback-based scheme and circuit for determining LOS and generating LOS_OUT improves over alternative circuit arrangements and processes in circuit size and speed. For example, alternatives that incorporate a RC filter for filtering LOS_OUT suffer from increased circuit size, cost, power consumption, and time from a LOS event occurring to generation of LOS_OUT indicating that the LOS event has occurred. Similarly, approaches utilizing a clock or PLL suffer from increased circuit size, cost, power consumption. At least some of these negative aspects of alternative approaches are mitigated and/or improved upon by the teachings of the present disclosure, including at least the use of switchable positive feedback provided by the feedback circuit 206 and/or the feedback circuit 208, such that the circuit 200 consumes less physical space and/or less power, costs less to implement, and/or determines LOS_OUT more rapidly than at least some of the alternative approaches described above.

Figure 3:
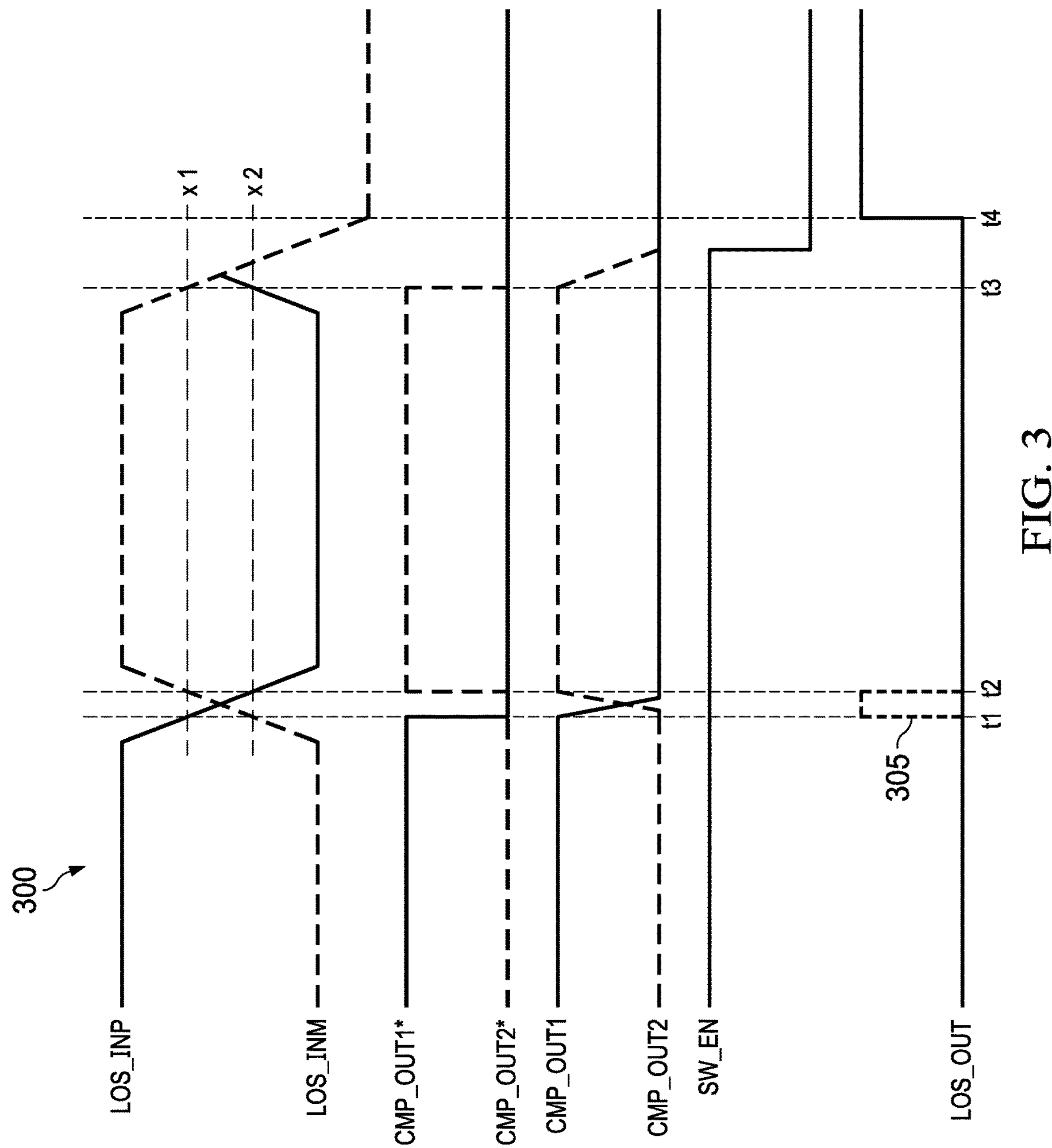
FIG. 3 shows a diagram of illustrative waveforms in accordance with various examples.

Turning now to FIG. 3, a diagram 300 of illustrative signal waveforms is shown. In at least some examples, the diagram 300 is illustrative of at least some signals present in the circuit 200 of FIG. 2 and/or the system 100 of FIG. 1. For example, the signals LOS_INP, LOS_INM, CMP_OUT1, CMP_OUT2, and LOS_OUT, according to one implementation of the circuit 200, are illustrated in the diagram 300. Additionally, the diagram 300 includes CMP_OUT1* and CMP_OUT2* which illustrate CMP_OUT1 and CMP_OUT2, respectively, in the absence of the teachings of the present disclosure (e.g., in the absence of circuitry and/or processing that mitigates the non-overlapping region shown for CMP_OUT1* and CMP_OUT2* between points t1 and t2).

As shown by diagram 300, and discussed above with respect to the circuit 200, CMP_OUT1* is asserted when LOS_INP-LOS_INM has a value greater than a threshold designated as x1. Similarly, CMP_OUT2* is de-asserted when LOS_INM-LOS_INP has a value less than x1. In at least some examples, x1 is approximately equal to VCM+VTH/2 where VCM is a common mode voltage of LOS_INP and LOS_INM and VTH is the internal reference threshold of the comparator 202 and comparator 204, discussed above with respect to FIG. 2. This creates a non-overlapping region for CMP_OUT1* and CMP_OUT2* between t1 and t2. This leads to a false LOS detection, designated in the diagram 300 by reference 305, being present in LOS_OUT, which detrimentally affects operations of one or more systems, circuits, or components that receive LOS_OUT. However, as shown by CMP_OUT1 and CMP_OUT2, under the teachings of the present disclosure the non-overlapping region between t1 and t2 is mitigated such that the false LOS detection 305 will not be present in LOS_OUT. For example, at t1 when LOS_INP-LOS_INM falls below x1, CMP_OUT1 begins to decrease in value until CMP_OUT1 is de-asserted at time t2. Similarly, at t1 when LOS_INM-LOS_INP rises above a second threshold designated as x2, CMP_OUT2 begins to increase in value until CMP_OUT2 is asserted at time t2. In at least some examples, x2 is approximately equal to VCM-VTH/2. In this way, no non-overlapping period exists between t1 and t2 when a transition occurs in LOS_INP and LOS_INM. At time t3, LOS_INM-LOS_INP (or LOS_INP-LOS_INM, depending on a pattern polarity of LOS_INP and LOS_INM) falls below x1 such that CMP_OUT2 becomes de-asserted, at which time SW_EN also becomes de-asserted. Both CMP_OUT1 and CMP_OUT2 being de-asserted indicates that a LOS event has occurred and triggers LOS_OUT to become asserted at time t4.

Figure 4:
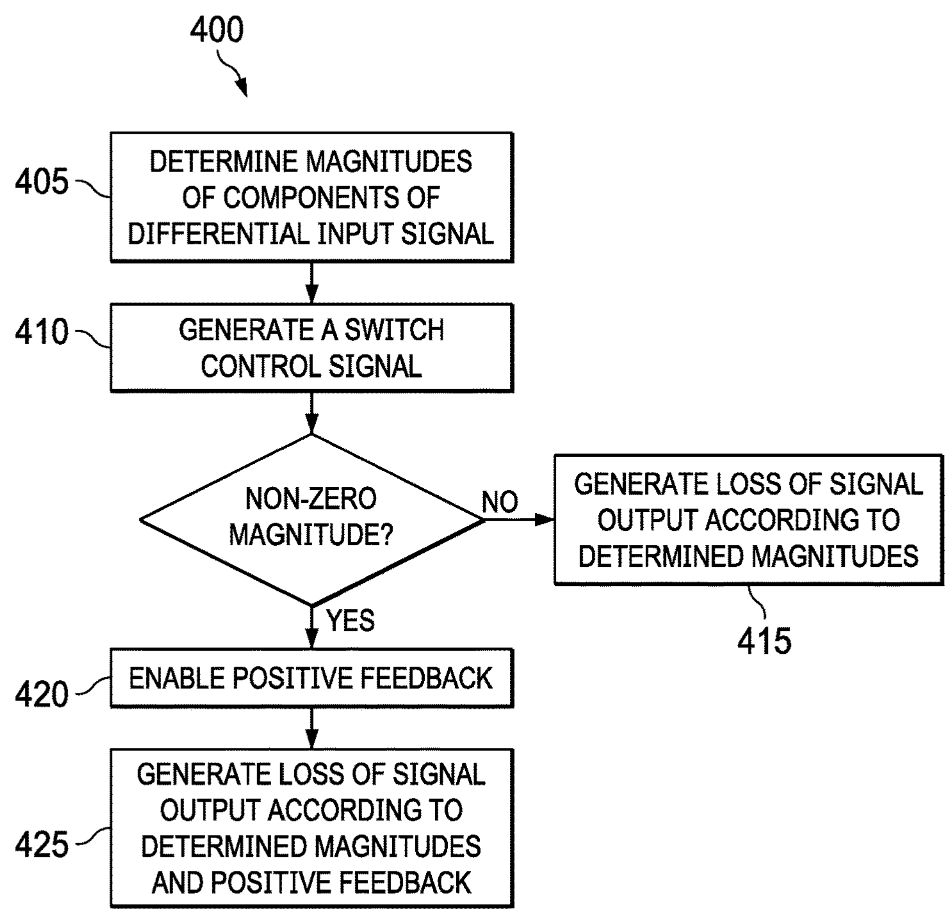
FIG. 4 shows a flowchart of an illustrative method in accordance with various examples.

Turning now to FIG. 4, a flowchart of an illustrative method 400 is shown. In at least some examples, the method 400 is a method of signal detection, such as LOS detection, and corresponds to one or more hardware components, circuits, devices, or systems disclosed here. For example, at least some portions of the system 100 and/or circuit 200 implement or perform one or more operations of the method 400.

At operation 405, magnitudes of positive and negative components of a differential input signal are determined. The magnitudes are determined, in some examples, by differential comparators. At operation 410, a switch control signal is generated. The switch control signal is generated, in some examples, by a time-dependent circuit, such as an RC timer or RC filter circuit in which a value of the switch control signal increases or decreases with time according to a time constant of the time-dependent circuit. The switch control signal, in at least some examples, controls enablement or disablement of one or more feedback circuits for providing positive feedback in a circuit including the differential comparators. The switch control signal, in some examples, increases in value when at least one determined magnitude of the positive or negative components of a differential input signal is non-zero. When neither determined magnitude is non-zero, the method 400 proceeds to operation 415. When at least one determined magnitude is non-zero and the switch control signal has increased in value above a switching threshold, the method 400 proceeds to operation 420. At operation 415, a LOS output is generated according to the determined magnitudes. The LOS output generated at operation 415, in some examples, indicates that a LOS event has occurred. In some examples, output signals of the differential comparators are processed by one or more logic circuits to generate the LOS output at operation 415. At operation 420, positive feedback is enabled. The positive feedback is enabled, in some examples, based on a value of the switch control signal. The positive feedback prevents and/or mitigates the existence of a non-overlapping region in the output signals of the differential comparators when a LOS event has not occurred (e.g., such as during normal transitioning of the output signals of the differential comparators during a bit transition of the differential input signal). At operation 425, the LOS output is generated according to the determined magnitudes and the positive feedback. The LOS output generated at operation 425, in some examples, indicates that a LOS event has not occurred. Generating the LOS output according to the determined magnitudes and the positive feedback, in at least some examples, prevents formation of a glitch or erroneous LOS trigger in the LOS output resulting from a non-overlapping region in the output signals of the differential comparators.

While the operations of the method 400 have been discussed and labeled with numerical reference, in various examples the method 400 includes additional operations that are not recited herein, in some examples any one or more of the operations recited herein include one or more sub-operations (e.g., such as intermediary comparisons, logical operations, output selections such as via a multiplexer, etc.), in some examples any one or more of the operations recited herein is omitted, and/or in some examples any one or more of the operations recited herein is performed in an order other than that presented herein (e.g., in a reverse order, substantially simultaneously, overlapping, etc.), all of which is intended to fall within the scope of the present disclosure.

In the foregoing discussion, the terms "including" and "comprising" are used in an open-ended fashion, and thus should be interpreted to mean "including, but not limited to. . . ." The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., FET, MOSFET, n-type, p-type, etc.), these components may be exchanged for components of other process technologies (e.g., replace FET and/or MOSFET with bi-polar junction transistor (BJT), replace n-type with p-type or vice versa, etc.) and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, “about”, “approximately”, or “substantially” preceding a value means +/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A LOS (loss of signal) detector circuit comprising:
- a first differential comparator having a first input, a second input, and an output;
- a second differential comparator having a first input coupled to the second input of the first differential comparator, a second input coupled to the first input of the first differential comparator, and an output;
- a first switched latch circuit having a first input coupled to the output of the first differential comparator, a second input coupled to the output of the second differential comparator and a control input;
- a first inverter having an input coupled to the output of the first differential comparator and an output;
- a second inverter having an input coupled to the output of the second differential comparator and an output; and
- a first logic circuit having a first input coupled to the output of the first inverter, a second input coupled to the output of the second inverter and an output.

2. The LOS detector circuit of claim 1, further comprising a second switched latch circuit coupled to the output of the first inverter and to the output of the second inverter.

3. The LOS detector circuit of claim 1, wherein the first logic circuit comprises an inverting AND (NAND) logic circuit.

4. The LOS detector circuit of claim 3, further comprising a third inverter having an input coupled to the output of the first logic circuit and an output.

5. The LOS detector circuit of claim 1, further comprising:
- a second logic circuit having a first input coupled to the output of the first differential comparator, a second input coupled to the output of the second differential comparator and an output;
- a resistor having a first terminal coupled to the output of the second logic circuit and a second terminal; and
- a capacitor having a first terminal coupled the second terminal of the resistor and a second terminal coupled to ground.

6. The LOS detector circuit of claim 5, wherein a switch control signal is generated at the first terminal of the capacitor and coupled to the control input of the first switched latch circuit, and wherein the switch control signal controls enablement and disablement of the first switched latch circuit.

7. The LOS detector circuit of claim 1, wherein the first switched latch circuit comprises:
- a first switch having a first terminal coupled to the output of the first differential comparator, a second terminal, and a third terminal coupled to the control input;
- a second switch having a first terminal coupled to the output of the second differential comparator, a second terminal and a third terminal coupled to the control input;
- a fourth inverter having an input coupled to the second terminal of the first switch and an output coupled to the second terminal of the second switch; and
- a fifth inverter having an input coupled to the second terminal of the second switch and an output coupled to the second terminal of the first switch.

8. A method for reducing false LOS (loss of signal) triggers comprising:
- determine magnitudes of components of a differential input signal provided to inputs of first and second differential comparators;
- generate a LOS signal when the magnitudes of the components of the differential signal are all below a threshold voltage;
- generate a switch control signal when any of the components of the differential signal are above the threshold voltage;
  - apply positive feedback to a signal across an output of the first differential comparator and an output of the second differential comparator when the switch control is generated;
- generate the LOS signal based on the signal across the output of the first differential comparator and the output of the second differential comparator after positive feedback has been applied.

* * * * *